(12) United States Patent
Tracy et al.

(10) Patent No.: US 9,627,558 B2
(45) Date of Patent: Apr. 18, 2017

(54) METHODS AND APPARATUSES FOR MANUFACTURING SELF-ALIGNED INTEGRATED BACK CONTACT HETEROJUNCTION SOLAR CELLS

(71) Applicants: Clarence J. Tracy, Tempe, AZ (US); Stanislau Herasimenka, Tempe, AZ (US)

(72) Inventors: Clarence J. Tracy, Tempe, AZ (US); Stanislau Herasimenka, Tempe, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 0 days.

(21) Appl. No.: 14/682,833

(22) Filed: Apr. 9, 2015

(65) Prior Publication Data
US 2015/0295125 A1 Oct. 15, 2015

Related U.S. Application Data

(60) Provisional application No. 61/977,383, filed on Apr. 9, 2014.

(51) Int. Cl.
*H01L 31/0224* (2006.01)
*H01L 31/0747* (2012.01)

(52) U.S. Cl.
CPC .. *H01L 31/022441* (2013.01); *H01L 31/0747* (2013.01); *Y02E 10/50* (2013.01)

(58) Field of Classification Search
CPC ........... H01L 31/202; H01L 31/022441; Y02P 70/521

USPC .......................................................... 438/96
See application file for complete search history.

(56) References Cited

U.S. PATENT DOCUMENTS

| | | | |
|---|---|---|---|
| 4,478,879 A | 10/1984 | Baraona et al. |
| 5,053,083 A | 10/1991 | Sinton |
| 6,423,567 B1 | 7/2002 | Ludemann et al. |
| 6,429,037 B1 | 8/2002 | Wenham et al. |
| 7,144,751 B2 | 12/2006 | Gee et al. |
| 7,217,883 B2 | 5/2007 | Muenzer |
| 7,999,175 B2 | 8/2011 | Nakayashiki et al. |
| 8,492,253 B2 | 7/2013 | Manning |
| 8,642,378 B1 | 2/2014 | Fogel et al. |

(Continued)

OTHER PUBLICATIONS

Aleman, M. et al., "Development and Integration of a High Efficiency Baseline Leading to 23% IBC Cells", In Energy Procedia, vol. 27, Apr. 2012, pp. 638-645.

(Continued)

*Primary Examiner* — Moazzam Hossain
*Assistant Examiner* — Omar Mojaddedi
(74) *Attorney, Agent, or Firm* — Byrne Poh LLP

(57) ABSTRACT

Methods and apparatuses for manufacturing self-aligned integrated back contact heterojunction solar cells are provided. In some embodiments, systems for forming a solar cell on a substrate are provided, the systems comprising: a master shadow mask positioned adjacent to the substrate on a first side of the master shadow mask; a first blocking mask placed adjacent to a second side of the master shadow mask; and a deposition machine that deposits material on the substrate through holes in the master shadow mask and the first blocking mask.

12 Claims, 7 Drawing Sheets

(56) References Cited

U.S. PATENT DOCUMENTS

| | | | |
|---|---|---|---|
| 2003/0108805 A1* | 6/2003 | Clark | C23C 14/042 430/22 |
| 2006/0110904 A1* | 5/2006 | Conrad | C23C 14/042 438/603 |
| 2010/0330712 A1* | 12/2010 | Lee | C23C 14/042 438/22 |
| 2011/0104618 A1 | 5/2011 | Bateman et al. | |
| 2011/0230010 A1* | 9/2011 | Guo | C23C 14/042 438/98 |
| 2013/0093049 A1* | 4/2013 | Ananthan | C23C 14/042 257/532 |
| 2013/0167915 A1 | 7/2013 | Moslehi et al. | |
| 2013/0295716 A1* | 11/2013 | Kawato | C23C 14/042 438/99 |
| 2013/0340680 A1* | 12/2013 | Sonoda | C23C 14/243 118/720 |
| 2015/0162483 A1* | 6/2015 | Weidman | H01L 31/182 136/256 |

OTHER PUBLICATIONS

De Iuliis, S. et al., "Interdigitated Back Contact Amorphous/Crystalline Silicon Heterojunction Solar Cells", In Technical Digest of the International PVSEC-17, Fukuoka, JP, Dec. 2007, pp. 397.

De Vecchi, S. et al., "New Metallization Scheme for Interdigitated Back Contact Silicon Heterojunction Solar Cells", In Energy Procedia, vol. 38, Mar. 2013, pp. 701-706.

Dross, F. et al., "18% Efficiency IBC Cell With Rear-Surface Processed on Quartz", In IEEE Journal of Photovoltaics, vol. 3, No. 2, Apr. 2013, pp. 684-689.

Geissbuehler, J. et al., "Amorphous/Crystalline Silicon Interface Defects Induced by Hydrogen Plasma Treatments", In Applied Physics Letters, vol. 102, No. 23, Jun. 2013, pp. 1-12.

Granata, S.N. et al., "Hydrogen-Plasma Etching of Thin Amorphous Silicon Layers for Heterojunction Interdigitated Back-Contact Solar Cells", In MRS Online Proceedings Library, vol. 1536, 2013, pp. 27-32.

Hegedus, S.S. et al., "Current Transport in Amorphous Silicon n/p Junctions and their Application as Tunnel Junctions in Tandem Solar Cells", In Applied Physics Letters, vol. 67, No. 6, Jun. 1995, pp. 813-815.

Herasimenka, S.Y et al., "Surface Preparation and Optimization of Amorphous Silicon Deposition for Silicon Heterojunction Solar Cells", In Proceedings of the 28th European Photovoltaic Solar Energy Conference and Exhibition (EU PVSEC '13), Villepinte, FR, Sep. 30-Oct. 4, 2013, pp. 1943-1946.

Herasimenka, S.Y et al., ">750 mV Open Circuit Voltage Measured on 50 μm Thick Silicon Heterojunction Solar Cell", In Applied Physics Letters, vol. 103, No. 5, Aug. 2013, pp. 1-5.

Herasimenka, S.Y et al., "A Simplified Process Flow for Silicon Heterojunction Interdigitated Back Contact Solar Cells: Using Shadow Masks and Tunnel Junctions", In Proceedings of the IEEE 40th Photovoltaic Specialists Conference (PVSC '14), Denver, CO, US, Jun. 8-13, 2014, pp. 2486-2490.

Herasimenka, S.Y et al., "Surface Passivation of n-type c-Si Wafers by a-Si/SiO2/SiNx Stack with <1 cm/s Effective Surface Recombination Velocity", In Applied Physics Letters, vol. 103, No. 18, Oct. 2013, pp. 1-6.

Hezel, R., "Novel Back Contact Silicon Solar Cells Designed for Very High Efficiencies and Low-Cost Mass Production", In Proceedings of the 29th IEEE Photovoltaic Specialists Conference, New Orleans, LA, US, May 19-24, 2002, pp. 114-117.

Kress, A. et al., "Low-Cost Back Contact Silicon Solar Cells", In IEEE Transactions on Electron Devices, vol. 46, No. 10, Oct. 1999, pp. 2000-2004.

Lee, S.-Y. et al., "Analysis of a-Si:H/TCO Contact Resistance for the Si Heterojunction Back-Contact Solar Cell", In Solar Energy Materials and Solar Cells, vol. 120, Part A, Jan. 2014, pp. 412-416.

Lu, M. et al., "Interdigitated Back Contact Silicon Heterojunction Solar Cell and the Effect of Front Surface Passivation", In Applied Physics Letters, vol. 91, No. 6, Aug. 2007, pp. 1-5.

Masuko, K. et al., "Achievement of More than 25% Conversion Efficiency with Crystalline Silicon Heterojunction Solar Cell", In IEEE Jounral of Photovoltaics, vol. 4, No. 6, Nov. 2014, pp. 1433-1435.

Meier, D.L. et al., "Self-Doping Contacts and Associated Silicon Solar Cell Structures", In Proceedings of the 2nd World Conference and Exhibition on Photovoltaic Solar Energy Conversion, Vienna, AT, Jul. 6-10, 1998, pp. 1491-1494.

Minigirulli, N. et al., "Efficient Interdigitated Back-Contacted Silicon Heterojunction Solar Cells", In Physica Status Solidi (RRL)—Rapid Research Letters, vol. 5, No. 4, Apr. 2011, pp. 159-161.

Papet, P. et al., "Realization of Self-Aligned Back-Contact Solar Cells", In Electrochemical and Solid-State Letters, vol. 11, No. 5, Feb. 2008, pp. H114-H117.

Reichel, C. et al., "Back-Contacted Back-Junction n-type Silicon Solar Cells featuring an Insulating Thin Film for Decoupling Charge Carrier Collection and Metallization Geometry", In Progress in Photovoltaics: Research and Applications, vol. 21, No. 5, Mar. 2012, pp. 1063-1076.

Smith, D. D. et al., "Generation III High Efficiency Lower Cost Technology: Transition to Full Scale Manufacturing", In Proceedings of the 38th IEEE Photovoltaic Specialists Conference (PVSC '12), Austin, TX, US, Jun. 3-8, 2012, pp. 001594-001597.

Taguchi, M. et al. "24.7% Record Efficiency HIT Solar Cell on Thin Silicon Wafer", In IEEE Journal of Photovoltaics, vol. 4, No. 1, Jan. 2014, pp. 96-99.

Verlinden, P.J. et al., "Simple Power-Loss Analysis Method for High-Efficiency Interdigitated Back Contact (IBC) Silicon Solar Cells", In Solar Energy & Solar Cells, vol. 106, Nov. 2012, pp. 27-41.

Yamaguchi, M., "III-V Compound Multi-Junction Solar Cells: Present and Future", In Solar Energy Materials and Solar Cells, vol. 75, No. 1-2, Jan. 2003, pp. 261-269.

Zin, N. et al., "Continued Development of All-Back-Contact Silicon Wafer Solar Cells at ANU", In Energy Procedia, vol. 33, Dec. 2013, pp. 50-63.

* cited by examiner

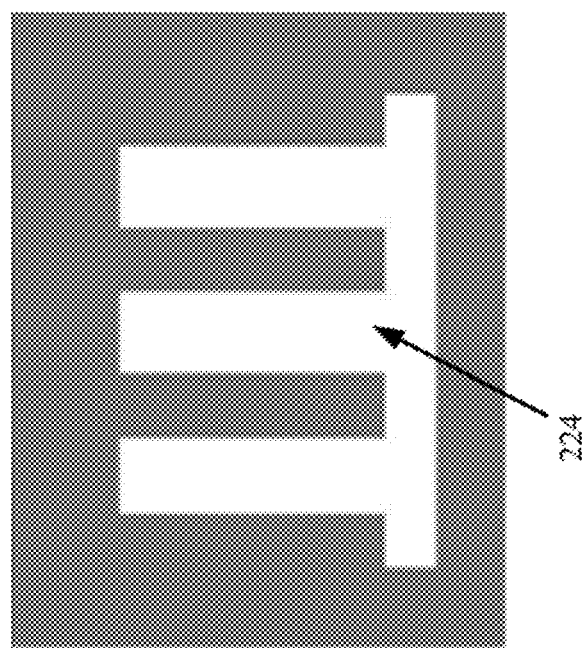
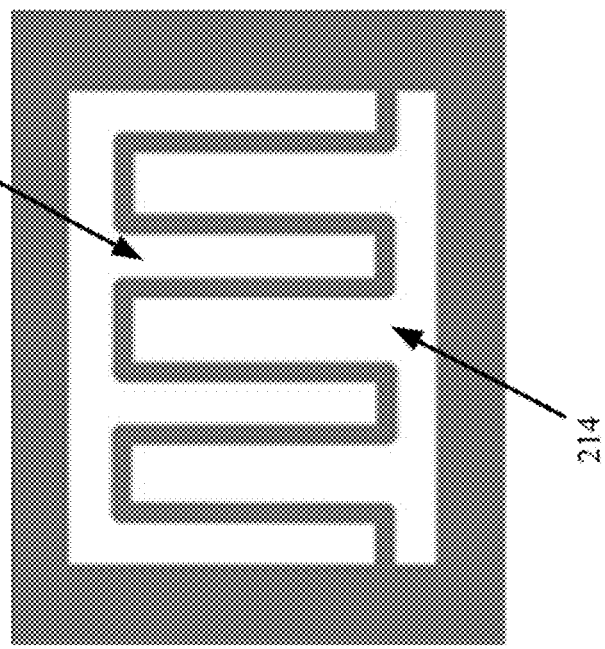
FIG. 2

METHODS AND APPARATUSES FOR MANUFACTURING SELF-ALIGNED INTEGRATED BACK CONTACT HETEROJUNCTION SOLAR CELLS

CROSS REFERENCE TO RELATED APPLICATION

This application claims the benefit of U.S. Provisional Patent Application No. 61/977,383, filed Apr. 9, 2014, which is hereby incorporated by reference herein in its entirety.

STATEMENT REGARDING GOVERNMENT FUNDED RESEARCH

This invention was made with government support under Grant No. 1041895 awarded by the National Science Foundation. The government has certain rights in the invention.

TECHNICAL FIELD

The disclosed subject matter relates to methods and apparatuses for manufacturing self-aligned integrated back contact heterojunction solar cells.

BACKGROUND

It is known that solar cells with both emitter and base contacts on the rear surface of the solar cell's substrate provide high efficiency and simplify the interconnection of cells together into a module. However, manufacturing such cells is expensive due to the difficulty of placing the closely spaced emitter and base contacts on the cells' substrates. Additionally, placing emitter/base metal on the cell's substrate requires carefully aligned photolithography and/or screen printed layers to prevent shorting and yield loss.

Accordingly, it is desirable to provide new methods and apparatuses for manufacturing self-aligned integrated back contact heterojunction solar cells.

SUMMARY

Methods and apparatuses for manufacturing self-aligned integrated back contact heterojunction solar cells are provided. In some embodiments, systems for forming a solar cell on a substrate are provided, the systems comprising: a master shadow mask positioned adjacent to the substrate on a first side of the master shadow mask; a first blocking mask placed adjacent to a second side of the master shadow mask; and a deposition machine that deposits material on the substrate through holes in the master shadow mask and the first blocking mask.

In some embodiments, methods for forming a solar cell on a substrate are provided, the methods comprising: positioning a master shadow mask adjacent to the substrate on a first side of the master shadow mask; placing a first blocking mask adjacent to a second side of the master shadow mask; and depositing material on the substrate through holes in the master shadow mask and the first blocking mask.

BRIEF DESCRIPTION OF THE DRAWINGS

Various objects, features, and advantages of the disclosed subject matter can be more fully appreciated with reference to the following detailed description of the disclosed subject matter when considered in connection with the following drawings, in which like reference numerals identify like elements.

FIG. 2 shows examples of a master shadow mask and a blocking mask for manufacturing self-aligned integrated back contact heterojunction solar cells in accordance with some embodiments of the disclosed subject matter.

DETAILED DESCRIPTION

In accordance with various embodiments, as described in more detail below, mechanisms, which can include methods and apparatuses, for manufacturing self-aligned integrated back contact heterojunction solar cells are provided.

These mechanisms can be used in conjunction with any suitable solar cell technologies. For example, in some embodiments, the mechanisms described herein can be used to form interdigitated p-type and n-type amorphous silicon (a-Si) strips and corresponding transparent conductive oxide (TCO) and metal layers for silicon heterojunction interdigitated back contact (SHJ-IBC) high efficiency solar cells using only a single alignment step and without using any resist patterning.

In some embodiments, the mechanisms described herein can use self-aligned shadow masks to replace more expensive pattern and etch or liftoff technologies. For example, the mechanisms described herein can use a master shadow mask with an overlying blocking mask to selectively generate self-aligned emitter and base structures without a critical or fine line patterning step.

In some embodiments, the mechanisms described herein can be used to deposit p-type and n-type a-Si layers, TCO layers, and metal layers through a stack of shadow masks, to form a low resistance tunnel junction between deposited p-type and n-type a-Si layers, and to form emitter and base contacts.

Figure 1:
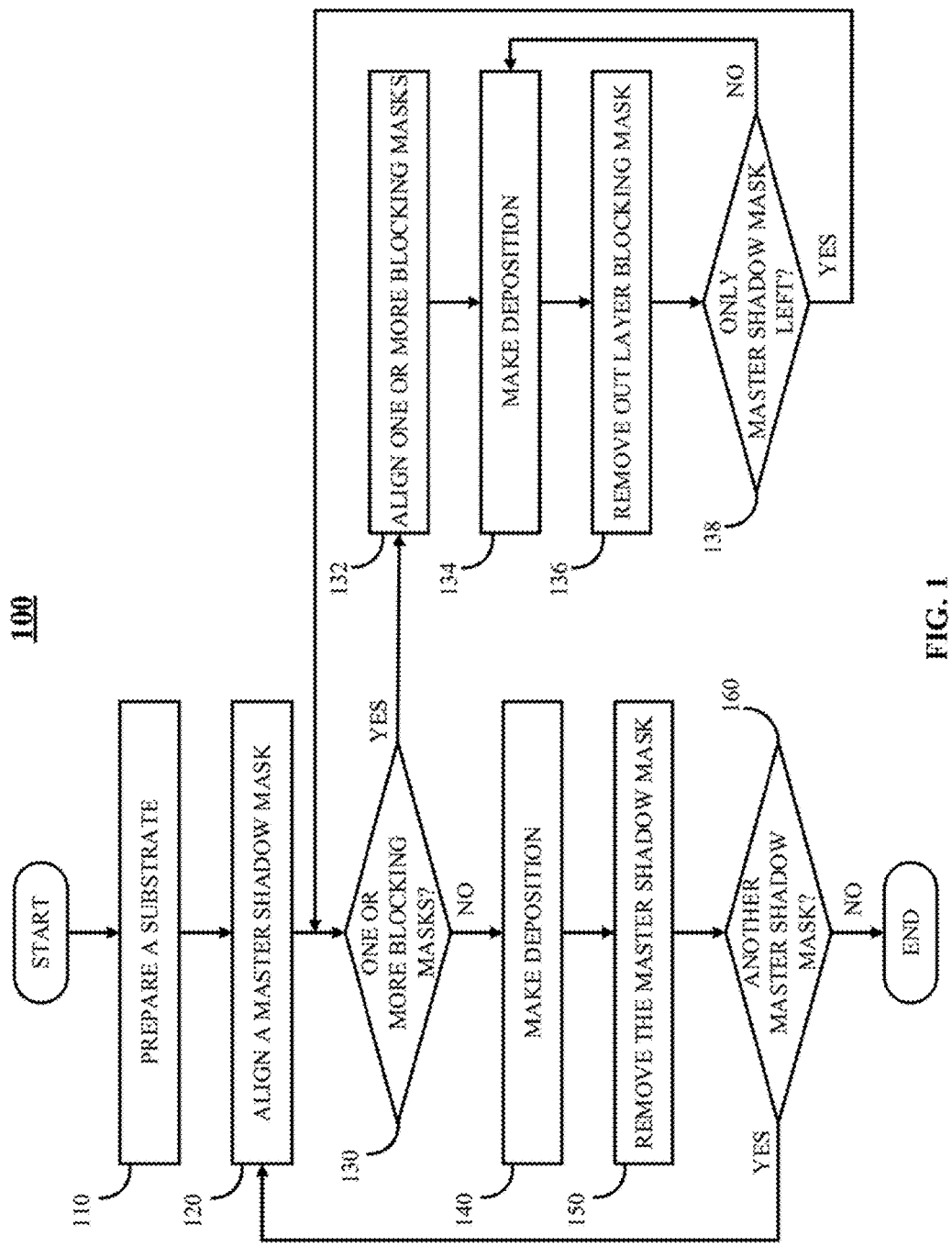
FIG. 1 shows an example of a process for manufacturing self-aligned integrated back contact heterojunction solar cells in accordance with some embodiments of the disclosed subject matter.

Turning to FIG. 1, an example of a process for manufacturing self-aligned integrated back contact heterojunction solar cells in accordance with some embodiments of the disclosed subject matter is shown.

As illustrated, process 100 can begin by preparing a substrate at 110. In some embodiments, the substrate can be any suitable type, can contain any suitable material or combination of materials, and can be prepared using any suitable technique or combination of techniques. For example, the material of the substrate can be silicon (Si), germanium (Ge), germanium silicon (GeSi), silicon carbide (SiC), or any other suitable semiconductor material. As another example, the substrate can be an n-type or p-type substrate which can be doped with a corresponding type of impurity ions such as boron ions, gallium ions, indium ions, and/or various combinations of such ions. In a more particular example, as described below in connection with FIG.

3, the substrate can be a single side textured n-type Czochralski (CZ) silicon wafer 310.

In some embodiments, process 100 can process the surfaces of the substrate for any suitable purposes such as cleaning and/or texture etching. For example, a surface field can be formed and surface passivation can be achieved by thermal oxidation. As another example, an amorphous silicon (a-Si) surface passivation technology can be used to apply a-Si layers as passivating layers in a-Si/silicon dioxide ($SiO_2$) nitride silicon ($SiN_x$) stacks to the surface of the substrate. In a more particular example, as described below in connection with FIG. 3, a stack of intrinsic amorphous silicon ((i)a-Si) and $SiN_x$ can be formed to serve as a surface passivation coating and an antireflection coating, respectively, at the front surface of the substrate (the surface where the light enters), while a layer of (i)a-Si can be formed on the rear surface to provide a surface passivation coating.

Next, at 120, process 100 can align a master shadow mask to the prepared substrate. In some embodiments, one or more shadow masks can be fabricated from any suitable material by any suitable technique. For example, a master shadow mask can be fabricated from a stainless steel sheet by laser cutting. As another example, a master shadow mask can be fabricated from ceramic material using a precision casting mold. In some embodiments, the master shadow mask can be loosely aligned and fixed to the rear of the prepared substrate in any suitable manner. For example, the master shadow mask can be attached by clamping. As another example, if a master shadow mask is fabricated by appropriate materials, it can be aligned by use of magnets.

At 130, process 100 can determine whether one or more blocking masks are going to be aligned. In some embodiments, at 132, in response to determining that one or more blocking masks are going to be aligned ("YES" at 130), process 100 can align the one or more blocking masks on top of the master shadow mask to cover selected openings in the master shadow mask. In some embodiments, a blocking mask can be attached to the master shadow mask in such a way that the blocking mask can be removed without disturbing the alignment between the master shadow mask and the substrate.

In some embodiments, process 100 can use any suitable method to increase the alignment tolerance. For example, process 100 can enlarge the openings in the blocking masks so that they are oversized compared to the openings in the master shadow mask in order to make the alignment easier. As another example, alignment crosses in the mask periphery can be used to improve alignment accuracy. As yet another example, the alignment on large areas can be done by optical cameras, which can be used to align screen printing patterns.

At 134, process 100 can perform deposition with the combined master shadow mask and one or more blocking masks in place. In some embodiments, one or more deposition processes can be performed using any suitable technique such as physical vapor deposition, chemical vapor deposition, electrochemical deposition, molecular beam epitaxy, atomic layer deposition, etc. In some embodiments, a deposition process can transfer a material through openings of the stacked master shadow mask and one or more blocking masks onto the substrate to form a thin film. In a particular example, as described below in FIG. 4, a low temperature plasma-enhanced chemical vapor deposition (PECVD) process can deposit (p+) a-Si material through the openings 414 of the combined master shadow mask 210 and blocking mask 220 to form heterojunction 440.

At 136, process 100 can remove the outer layer blocking mask without disturbing the other mask(s). Next, if there is one or more blocking masks combined with the master shadow mask ("NO" at 138), process 100 can return to 134 to perform further deposition. Alternatively, if there is only the master shadow mask left ("YES" at 138), process 100 can return to 130 to determine whether another set of one or more blocking masks need to be aligned.

In some embodiments, in response to determining that no more blocking masks need to be aligned ("NO" at 130), process 100 can perform deposition with the master shadow mask at 140. In some embodiments, a plurality of layers can by formed by multiple deposition processes. For example, as described below in FIG. 5, an (n+) a-Si layer, a transparent conductive oxide (TCO) layer, and a metal layer can be formed by depositing corresponding materials through the openings of the master shadow mask successively. Similarly, one or more deposition processes can be performed using any suitable technique. For example, an (n+) a-Si layer can be formed using a low temperature PECVD technique. As another example, metal can be deposited using physical vapor deposition (e.g., evaporation, sputtering, etc.) to provide highly conductive connections.

Next, at 150, the master shadow mask can be removed and process 100 can determine if another deposition with another master shadow mask is going to be performed at 160. For example, for improving reliability, an additional coating of dielectric protection (e.g., PECVD silicon nitride) may be added in some embodiments. In such an example, in response to determining that another master shadow mask needs to be aligned ("YES" at 160), process 100 can return to 120 to align another master shadow mask which can leave exposed metal regions for solder connections (for example) in the module. In some embodiments, if the determination at 160 is "NO", process 100 can end.

It should be noted that the above steps of the flow diagram of FIG. 1 can be executed or performed in any order or sequence not limited to the order and sequence shown and described in the figure. Also, some of the above steps of the flow diagram of FIG. 1 can be executed or performed substantially simultaneously where appropriate or in parallel to reduce latency and processing times. Furthermore, it should be noted that FIG. 1 is provided as an example only. At least some of the steps shown in the figure may be performed in a different order than represented, performed concurrently, or altogether omitted.

Turning to FIG. 2, an example 210 of a master shadow mask and an example 220 of a blocking mask in accordance with some embodiments of the disclosed subject matter are shown. In some embodiments, master shadow mask 210 and blocking mask 220 can be made from any suitable material or combination of materials. For example, one or more masks can be made of material stiff enough (e.g., various ceramic materials) for use in PECVD and sputtering chambers. As another example, one or more masks can be made from magnetic materials and can be held in place with small permanent magnet holders. In a more particular example, master shadow mask 210 and blocking mask 220 can be fabricated from 127 μm thick stainless steel sheets by laser cutting.

As illustrated in FIG. 2, the patterns of master shadow mask 210 and blocking mask 220 are shown in top view. As shown, master shadow mask 210 can have an approximately 100 μm-wide and 12-cm-long serpentine line which divides a rectangle opening in the four-border frame into two parts: n-type opening 212; and p-type opening 214. As also shown, blocking mask 220 can have p-type opening 224, and can block the region corresponding to the n-type opening 212 in the master shadow mask. In some embodiments, p-type opening 224 in the blocking mask 220 can be oversized compared to the p-type opening 214 in the master shadow mask to ease alignment.

Figure 7:
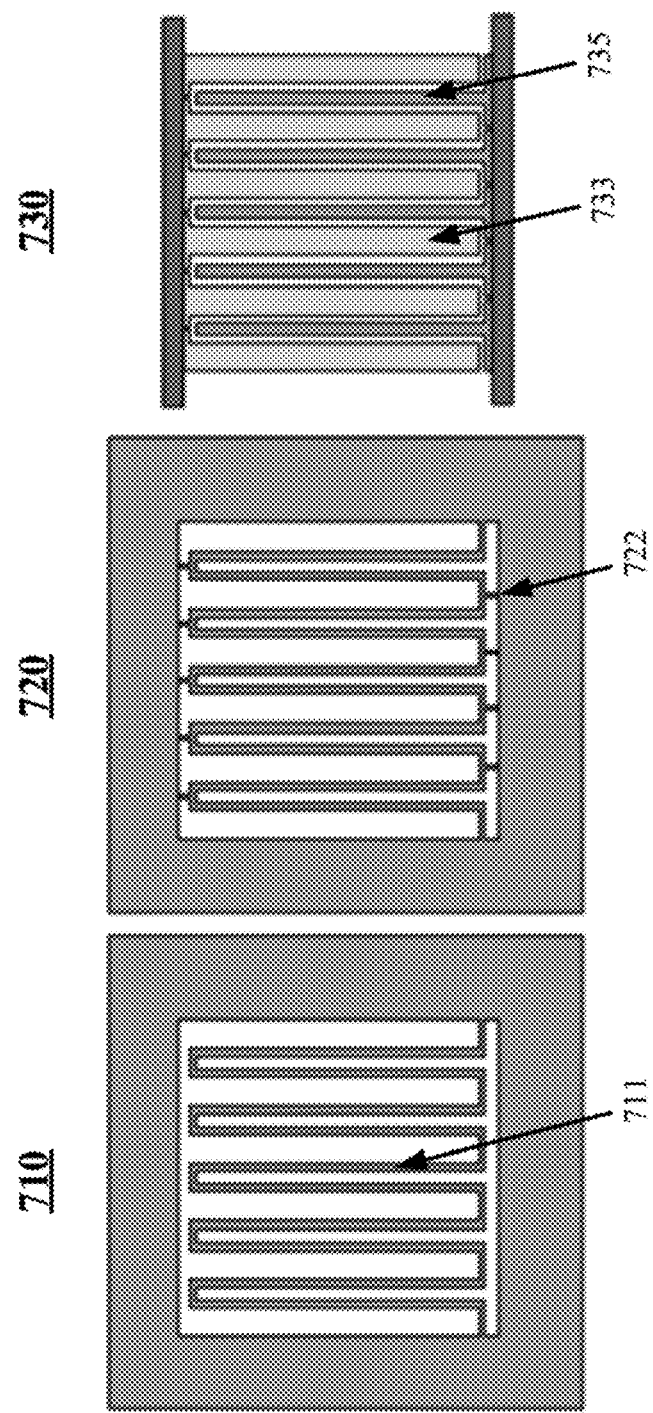
FIG. 7 shows examples of large area masks in accordance with some embodiments of the disclosed subject matter.

In some embodiments, when making large area masks, for example, as illustrated in FIG. 7, serpentine line structure 711 in shadow mask 710 can be unstable and fragile. To solve this problem, any suitable manufacturing technique can be used to consolidate and/or enhance the patterned structures of large area masks. For example, bridges 722 can be used to support serpentine line structure 711. As another example, teeth of comb structures 733 and 735 can be used to make an enhanced shadow mask 730 with serpentine line gap.

Figure 3:
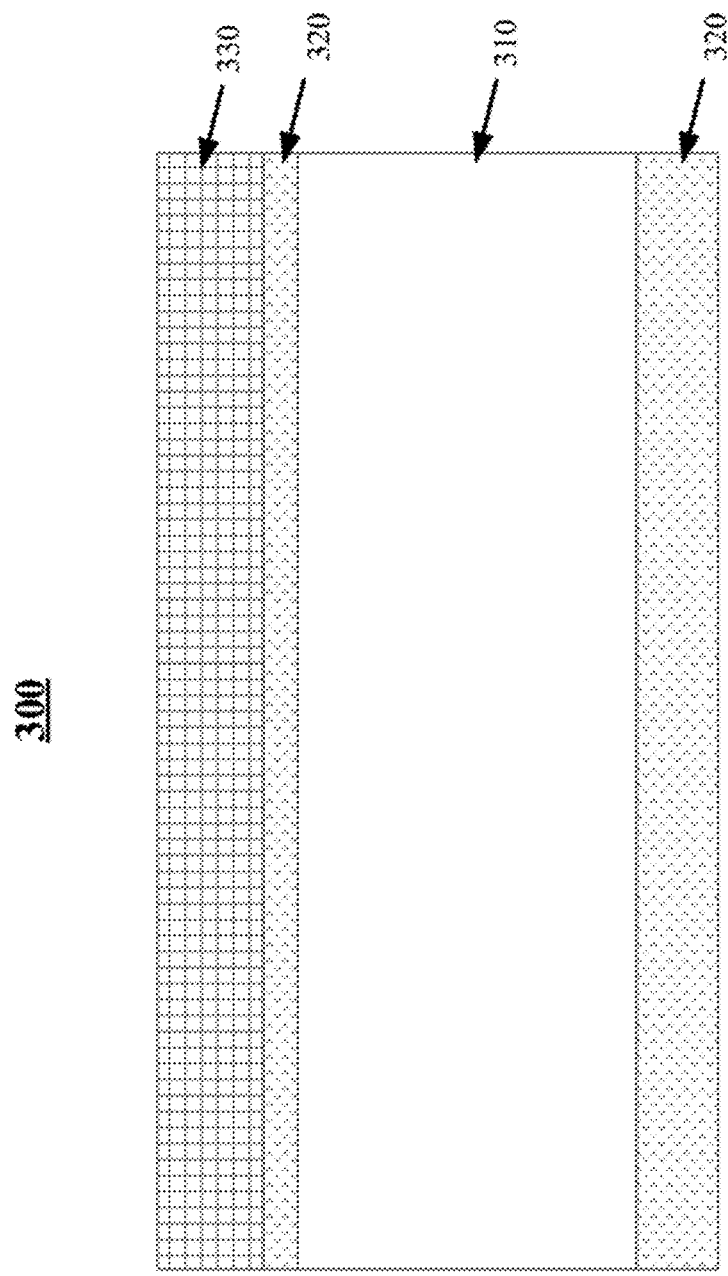
FIGS. 3-5 show cross-sectional views of an example of a solar cell during fabrication steps in accordance with some embodiments of the disclosed subject matter.
Figure 4:
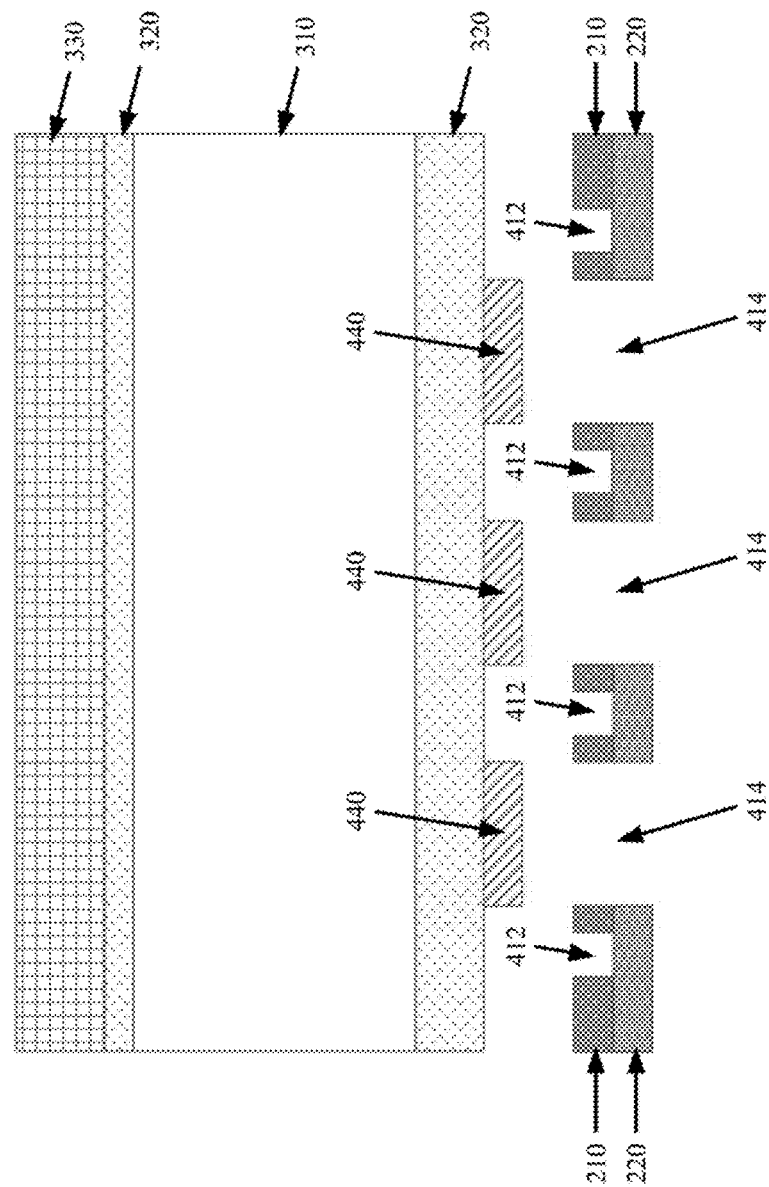
Figure 5:
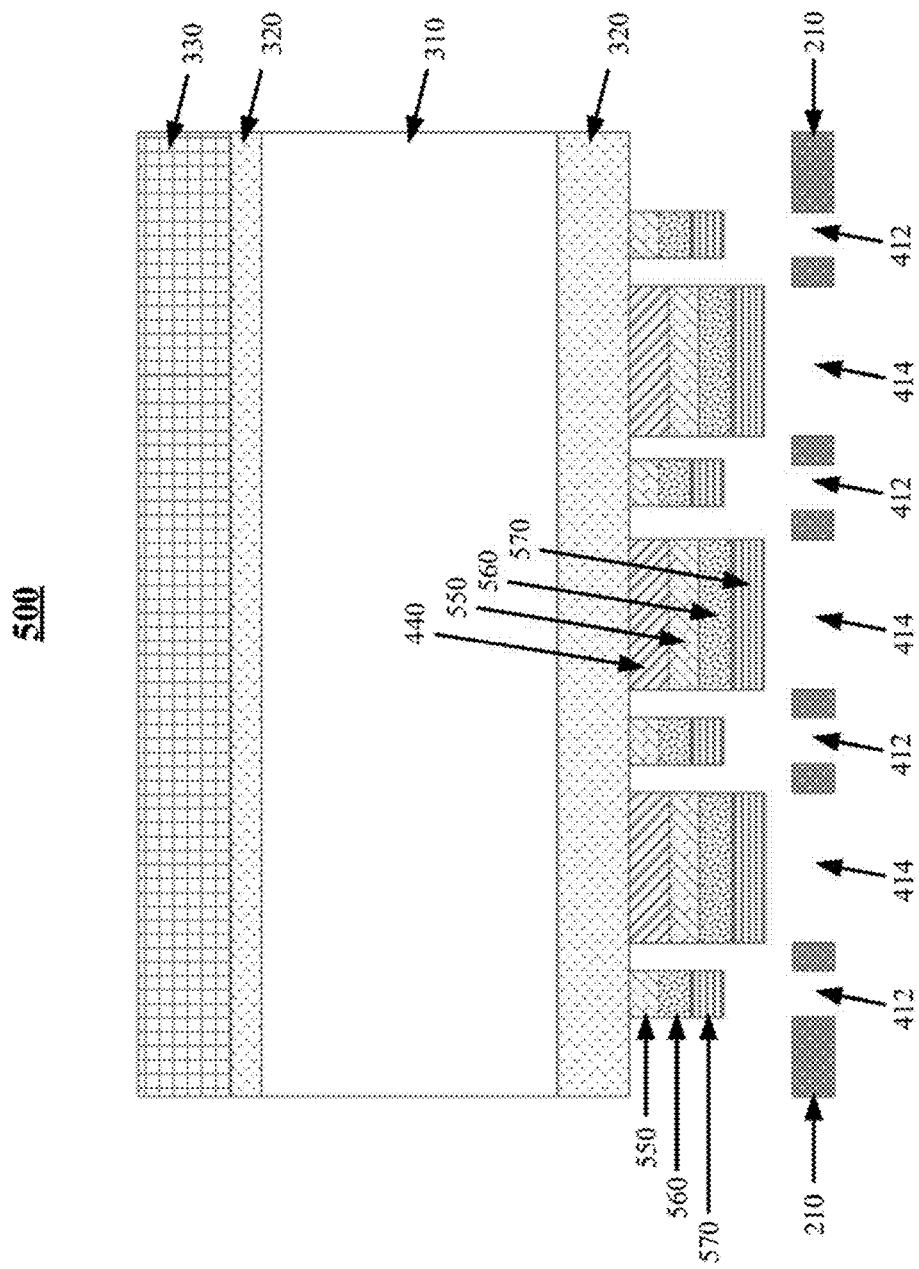

FIGS. 3-5 show cross-sectional views of an example of a solar cell during fabrication steps in accordance with some embodiments of the disclosed subject matter.

Referring to FIG. 3, a single side textured n-type crystal silicon solar substrate passivated with (i)a-Si and $SiN_x$ anti reflection coating is shown in cross-sectional view in accordance with some embodiments. In some embodiment, an n-type single crystal silicon wafer 310 can be grown by the Czochralski process. In some embodiments, wafer 310 can be a pseudosquare in shape with 3-4 Ohm-cm resistivity and 120 μm thicknesses.

In some embodiments, wafer 310 can be textured in potassium hydroxide iso-Propyl alcohol (KOH-IPA) solution with the rear side protected by a SiNx layer. After a KOH cleaning, (i)a-Si passivation layers 320 can be formed by deposition on both sides of wafer 310 using a standard Applied Materials P-5000 cluster PECVD. Then, a SiNx layer 330 can be formed by deposition on the front side of wafer 310 to serve as an antireflection coating.

Next, referring to FIG. 4, deposition of a (p+) a-Si layer 440 through the stack of master shadow mask 210 and blocking mask 220 is shown in cross-sectional view in accordance with some embodiments.

Firstly, a master shadow mask 210 and a blocking mask 220 can be aligned adjacent to the rear surface of wafer 310. In such an alignment, n-type opening 412 can be covered by blocking mask 220, while p-type opening 414 can be exposed.

Figure 6:
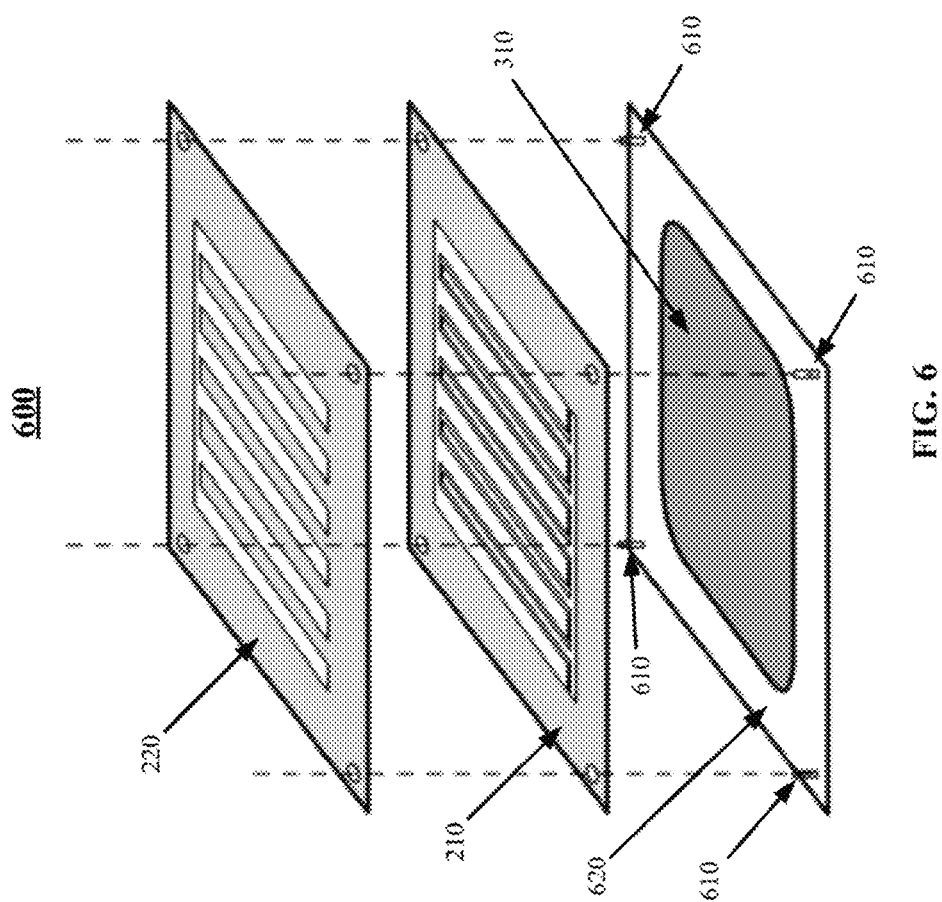
FIG. 6 shows a 3D view of an example of an alignment of a master shadow mask and a blocking mask using pins built into a wafer carrier in accordance with some embodiments.

In some embodiments, master shadow mask 210 can taped to the rear side of wafer 310 by Kapton tape, while blocking mask 220 can be manually aligned and attached over the master shadow mask 210 by magnetic coupling with magnets located underneath wafer 310 on the carrier (not shown). In some other embodiments, as illustrated in FIG. 6, master shadow mask 210 and blocking mask 220 can be aligned using the pins 610 built into the wafer carrier 620.

Then, a plasma-enhanced chemical vapor deposition (PECVD) process can deposit (p+) a-Si material through p-type opening 414 of the stack of master shadow mask 210 and blocking mask 220 to generate (p+) a-Si layer 440, forming a p-tunnel junction contact (heterojunction).

Turning to FIG. 5, deposition of an (n+) a-Si layer 550, a TCO layer 560, and a metal layer 570 through master shadow mask 210 is shown in cross-sectional view in accordance with some embodiments. In some embodiments, after (p+) a-Si layer 440 is deposited, blocking mask 220 can be removed without disturbing master shadow mask 210. Subsequently, (n+) a-Si layer 550 can be deposited by PECVD through n-type opening 412 and p-type opening 414 of master shadow mask 210, forming a base contact in regions where no p+ layer 440 is present, and forming an emitter contact (tunnel junction contact) to p+ layer 440 where it is present. The thickness of (n+) a-Si layer 550 can be varied and related to the open-circuit voltage (Voc) and the fill factor (FF) optimization parameters.

Next, transparent conductive oxide (TCO) layer 560 and metal layer 570 can be respectively deposited through n-type opening 412 and p-type opening 414 of master shadow mask 210. In some embodiments, TCO layer 560 and metal layer 570 can be deposited using any suitable physical vapor deposition (PVD) system such as a KDF 954 sputtering tool available from KDF Electronic & Vacuum Services Inc. of Rockleigh, N.J.

Finally, although not shown in FIG. 5, master shadow mask 210 can be removed and a SiNx capping layer can be deposited on the entire rear surface to protect (i)a-Si exposed in the gaps between n-type and p-type strips. The cells then can be probed by punching through SiNx layer. For the cells to be interconnected in photovoltaic (PV) modules, SiNx can be, for example, opened locally at the interconnection islands by etching. In this case, the alignment tolerance can be on the order of millimeters.

The provision of the examples described herein (as well as clauses phrased as "such as," "e.g.," "including," and the like) should not be interpreted as limiting the claimed subject matter to the specific examples; rather, the examples are intended to illustrate only some of many possible aspects.

Accordingly, methods and apparatuses for manufacturing self-aligned integrated back contact heterojunction solar cells are provided.

Although the disclosed subject matter has been described and illustrated in the foregoing illustrative embodiments, it is understood that the present disclosure has been made only by way of example, and that numerous changes in the details of embodiment of the disclosed subject matter can be made without departing from the spirit and scope of the disclosed subject matter, which is limited only by the claims that follow. Features of the disclosed embodiments can be combined and rearranged in various ways.

What is claimed is:

1. A system for forming a solar cell on a substrate, comprising:
   a master shadow mask in contact with the substrate on a first side of the master shadow mask, wherein the master shadow mask has a plurality of holes that go from the first side to a second side of the master shadow mask, and wherein the master shadow mask is of uniform thickness;
   a first blocking mask in contact with the second side of the master shadow mask, wherein the first blocking mask has a plurality of holes that go from a first side of the first blocking mask to a second side of the first blocking mask, wherein the first blocking mask is of uniform thickness, and wherein the first blocking mask covers at least one hole of the plurality of holes of the master shadow mask; and
   a deposition machine that deposits material on the substrate through the plurality of holes in the master shadow mask and the plurality of holes in the first blocking mask.

2. The system of claim 1, further comprising a second blocking mask in contact with the first blocking mask.

3. The system of claim 1, wherein the material is (p+) a-Si.

4. The system of claim 1, wherein the deposition machine is a plasma-enhanced chemical vapor deposition machine.

5. The system of claim 1, further comprising pins that align the master shadow mask and the first blocking mask.

6. The system of claim 1, further comprising a plurality of magnets that secure the first blocking mask relative to the substrate.

7. A method for forming a solar cell on a substrate, comprising:
positioning a master shadow mask in contact with the substrate on a first side of the master shadow mask, wherein the master shadow mask has a plurality of holes that go from the first side to a second side of the master shadow mask, and wherein the master shadow mask is of uniform thickness;
placing a first blocking mask in contact with the second side of the master shadow mask, wherein the first blocking mask has a plurality of holes that go from a first side of the first blocking mask to a second side of the first blocking mask, and wherein the first blocking mask is of uniform thickness, and wherein the first blocking mask covers at least one hole of the plurality of holes of the master shadow mask; and
depositing material on the substrate through the plurality of holes in the master shadow mask and the plurality of holes in the first blocking mask.

8. The method of claim 7, further comprising positioning a second blocking mask in contact with the first blocking mask.

9. The method of claim 7, wherein the material is (p+) a-Si.

10. The method of claim 7, wherein the depositing of material is performed using a plasma-enhanced chemical vapor deposition machine.

11. The method of claim 7, further comprising aligning the master shadow mask and the first blocking mask using pins.

12. The method of claim 7, further comprising securing the first blocking mask relative to the substrate using a plurality of magnets.

* * * * *